US012469824B2

(12) United States Patent
Yamaguchi et al.

(10) Patent No.: US 12,469,824 B2
(45) Date of Patent: Nov. 11, 2025

(54) INTEGRATED CIRCUIT AND RADIO-FREQUENCY MODULE

(71) Applicant: Murata Manufacturing Co., Ltd., Kyoto (JP)

(72) Inventors: Yukiya Yamaguchi, Kyoto (JP); Takanori Uejima, Kyoto (JP); Motoji Tsuda, Kyoto (JP); Yuji Takematsu, Kyoto (JP); Shunji Yoshimi, Kyoto (JP); Satoshi Arayashiki, Kyoto (JP); Mitsunori Samata, Kyoto (JP); Satoshi Goto, Kyoto (JP); Yutaka Sasaki, Kyoto (JP); Masayuki Aoike, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 393 days.

(21) Appl. No.: 18/315,855

(22) Filed: May 11, 2023

(65) Prior Publication Data

US 2023/0282620 A1  Sep. 7, 2023

Related U.S. Application Data

(63) Continuation of application No. PCT/JP2021/041931, filed on Nov. 15, 2021.

(30) Foreign Application Priority Data

Dec. 2, 2020  (JP) ................. 2020-200130

(51) Int. Cl.
  *H01L 25/065*  (2023.01)
(52) U.S. Cl.
  CPC ............. *H01L 25/0657* (2013.01); *H01L 2225/06517* (2013.01); *H01L 2225/06589* (2013.01)

(58) Field of Classification Search
  CPC ....... H01L 23/66; H01L 23/36; H01L 23/373; H01L 25/074
  See application file for complete search history.

(56) References Cited

U.S. PATENT DOCUMENTS

| 2002/0064029 A1 | 5/2002 | Pohjonen |
| 2006/0138460 A1* | 6/2006 | Sasaki .................... H01L 23/66 |
| | | 257/E29.189 |

(Continued)

FOREIGN PATENT DOCUMENTS

| CN | 111508947 A * | 8/2020 | ......... H01L 25/0657 |
| JP | 2000-223659 A | 8/2000 | |

(Continued)

OTHER PUBLICATIONS

International Search Report for PCT/JP2021/041931 dated Jan. 18, 2022.

*Primary Examiner* — Evren Seven
(74) *Attorney, Agent, or Firm* — McDonald Hopkins LLC (57) ABSTRACT

An integrated circuit includes a first base that has at least a part formed of a first semiconductor material and that includes an electric circuit, a second base that has at least a part formed of a second semiconductor material having a thermal conductivity lower than the first semiconductor material and that includes a power amplifier circuit, and a high thermal conductive member that has at least a part formed of a high thermal conductive material having a thermal conductivity higher than the first semiconductor material and that is disposed between the electric circuit and the power amplifier circuit. At least a part of the high thermal conductive member overlaps at least a part of the first base and at least a part of the second base in plan view. The high thermal conductive member is in contact with the first base and the second base.

17 Claims, 5 Drawing Sheets

(56) References Cited

U.S. PATENT DOCUMENTS

| | | | |
|---|---|---|---|
| 2007/0176298 A1 | 8/2007 | Osone et al. | |
| 2010/0059879 A1 | 3/2010 | Bielen et al. | |
| 2013/0321082 A1 | 12/2013 | Yamada | |
| 2017/0338847 A1 | 11/2017 | Reisner et al. | |
| 2019/0097599 A1 | 3/2019 | Taniguchi et al. | |
| 2024/0079401 A1* | 3/2024 | Or-Bach | H01L 21/28194 |
| 2024/0363488 A1* | 10/2024 | Lin | H01L 23/49827 |
| 2024/0379553 A1* | 11/2024 | Or-Bach | H10B 80/00 |

FOREIGN PATENT DOCUMENTS

| | | | | |
|---|---|---|---|---|
| JP | 2002-217650 A | | 8/2002 | |
| JP | 2005-302873 A | | 10/2005 | |
| JP | 2007-188916 A | | 7/2007 | |
| JP | 2009-541985 A | | 11/2009 | |
| JP | 2013-251330 A | | 12/2013 | |
| JP | 2019-062350 A | | 4/2019 | |
| KR | 20100104493 A | * | 9/2010 | H01L 23/36 |
| WO | WO-2017183222 A1 | * | 10/2017 | H01L 21/52 |

\* cited by examiner

INTEGRATED CIRCUIT AND RADIO-FREQUENCY MODULE

CROSS REFERENCE TO RELATED APPLICATION

This is a continuation of International Application No. PCT/JP2021/041931 filed on Nov. 15, 2021 which claims priority from Japanese Patent Application No. 2020-200130 filed on Dec. 2, 2020. The contents of these applications are incorporated herein by reference in their entireties.

BACKGROUND OF THE DISCLOSURE

Field of the Disclosure

The present disclosure relates to an integrated circuit and a radio-frequency module.

Description of the Related Art

Mobile communication devices such as a cellular phone have more complicated arrangement configurations of circuit devices, which are included in radio-frequency front-end circuits, particularly with advances in multiband technology.

The radio-frequency module described in Patent Document 1 achieves a reduction in size of the radio-frequency module by stacking controllers above power amplifiers disposed on a packaging substrate.

Patent Document 1: U.S. Patent Application Publication No. 2017/0338847

BRIEF SUMMARY OF THE DISCLOSURE

However, in the related art described above, the heat generated by the power amplifiers may be discharged insufficiently. The characteristics of the power amplifiers may be degraded due to the heat.

Accordingly, the present disclosure provides an integrated circuit and a radio-frequency module which achieve contribution to a reduction in size of the radio-frequency module and which achieve the suppression of the degradation of the characteristics of a power amplifier circuit due to the heat.

An integrated circuit according to an aspect of the present disclosure includes a first base that has at least a part formed of a first semiconductor material and that includes an electric circuit, a second base that has at least a part formed of a second semiconductor material having a thermal conductivity lower than the first semiconductor material and that includes a power amplifier circuit, and a high thermal conductive member that has at least a part formed of a high thermal conductive material having a thermal conductivity higher than the first semiconductor material and that is disposed between the electric circuit and the power amplifier circuit. At least a part of the high thermal conductive member overlaps at least a part of the first base and at least a part of the second base in plan view. The high thermal conductive member is in contact with the first base and the second base.

An integrated circuit according to an aspect of the present disclosure includes a first base that has at least a part formed of silicon or gallium nitride and that includes an electric circuit, a second base that has at least a part formed of gallium arsenide or silicon germanium and that includes a power amplifier circuit, and a high thermal conductive member that has at least a part formed of copper and that is disposed between the electric circuit and the power amplifier circuit. At least a part of the high thermal conductive member overlaps at least a part of the first base and at least a part of the second base in plan view. The high thermal conductive member is in contact with the first base and the second base.

The integrated circuit according to an aspect of the present disclosure achieves contribution to a reduction in size of a radio-frequency module and achieves the suppression of the degradation of the characteristics of a power amplifier circuit due to heat.

DETAILED DESCRIPTION OF THE DISCLOSURE

Embodiments of the present disclosure will be described below in detail by using the drawings. Each embodiment described below is a comprehensive or concrete example. The numeral values, the shapes, the materials, the components, the layout and the connection form of components, and the like described in the embodiments described below are exemplary, and are not intended to limit the present disclosure.

The figures are schematic views with appropriate emphasis, abbreviation, or adjustment of ratios for illustration of the present disclosure, and are not necessarily illustrated strictly. The shapes, the positional relationship, and the ratios may be different from the actual ones. In the figures, substantially the same configurations are designated with the same reference numerals. Repeated description may be skipped or simplified.

In the figures described below, x axis and y axis are orthogonal to each other in a plane parallel to a principal surface of a module substrate. Specifically, when a module substrate is rectangular in plan view, x axis is parallel to a first side of the module substrate; y axis is parallel to a second side orthogonal to the first side of the module substrate. In addition, z axis is perpendicular to the principal surface of the module substrate. The positive direction of z axis indicates the upward direction; its negative direction indicates the downward direction.

In a circuit configuration in the present disclosure, "to be connected" encompasses, not only the case of direct connection using a connection terminal and/or a wiring conductor, but also the case of electrical connection via other circuit devices. "To be connected between A and B" means connection, between A and B, to both A and B.

In a component layout in the present disclosure, "in plan view" means viewing an object subjected to orthogonal projection to the xy plane from the z-axis positive side. "In plan view, A overlaps B" means that the area of A subjected to orthogonal projection to the xy plane overlaps the area of B subjected to orthogonal projection to the xy plane. "In plan view, A is disposed between B and C" means that at least one of line segments connecting any points in the area of B, which is projected to the xy plane, to any points in the area of C, which is projected to the xy plane, passes through the area of A, which is projected to the xy plane. "In cross-sectional view" means viewing a cross section which is perpendicular to the xy plane and which is obtained through cutting. "In cross-sectional view, A is disposed between B and C" means that, in a cross section perpendicular to the xy plane, at least one of line segments connecting any points in the area of B to any points in the area of C passes through the area of A. Terms indicating the relationships between components, such as "parallel" and "perpendicular", terms indicating the shapes of components, such as "rectangular", and numeral ranges are not intended to have only strict meaning, and mean substantially equivalent ranges, for example, having errors in the order of a few percent.

In addition to placement of a component on a substrate in the state in which the component is in contact with the substrate, "to dispose a component on/in a substrate" encompasses placement of a component above a substrate in the state in which the component is not in contact with the substrate (for example, the component is laminated on another component disposed on the substrate), and placement of a component in the state in which a part or the entirety of the component is embedded in the substrate. In addition to placement of a component on a principal surface of a substrate in the state in which the component is in contact with the principal surface, "to dispose a component on a principal surface of a substrate" encompasses placement of a component above a principal surface in the state in which the component is not in contact with the principal surface, and placement of a component in the state in which a part of the component is embedded in a substrate from the principal surface side.

In a material composition described in the present disclosure, "object A is formed of material B" means that the main component of A is B. The main component means a component having the largest weight ratio among the multiple components contained by an object.

Embodiment 1.1 The Circuit Configuration of a Radio-Frequency Module 1 and a Communication Device 5

Figure 1:
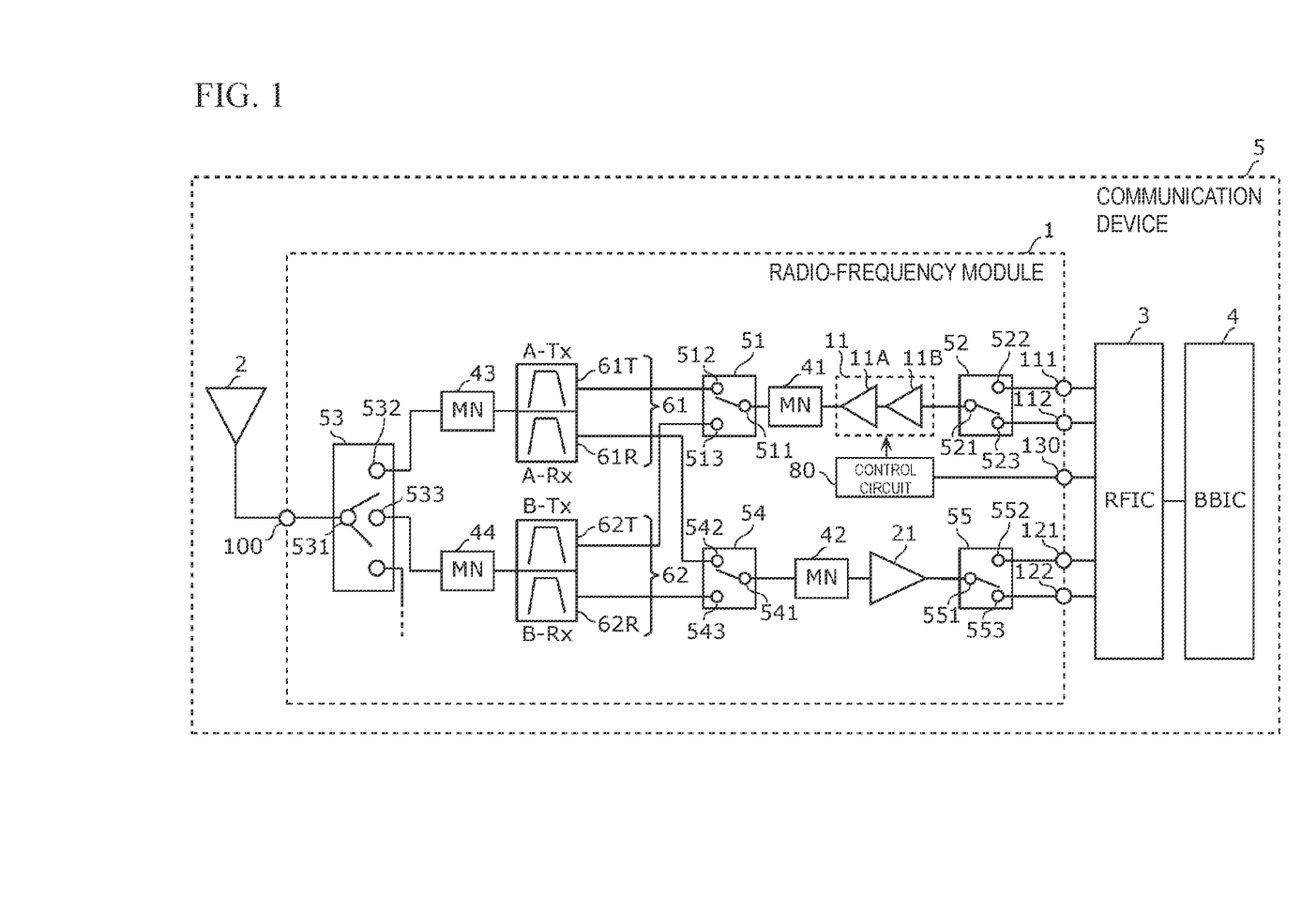
FIG. 1 is a diagram illustrating the circuit configuration of a radio-frequency module and a communication device according to an embodiment.

The circuit configuration, according to the present embodiment, of a radio-frequency module 1 and a communication device 5, which includes the radio-frequency module 1, will be described by referring to FIG. 1. FIG. 1 is a diagram illustrating the circuit configuration of the radio-frequency module 1 and the communication device 5 according to the embodiment.

[1.1.1 The Circuit Configuration of the Communication Device 5]

As illustrated in FIG. 1, the communication device 5 according to the present embodiment includes the radio-frequency module 1, an antenna 2, an RFIC (Radio Frequency Integrated Circuit) 3, and a BBIC (Baseband Integrated Circuit) 4.

The radio-frequency module 1 transports radio-frequency signals between the antenna 2 and the RFIC 3. The internal configuration of the radio-frequency module 1 will be described below.

The antenna 2, which is connected to an antenna connection terminal 100 of the radio-frequency module 1, receives radio-frequency signals from the outside, and outputs the radio-frequency signals to the radio-frequency module 1.

The RFIC 3 is an exemplary signal processing circuit which processes radio-frequency signals. Specifically, the RFIC 3 performs signal processing such as down-converting on radio-frequency receive signals received through the receive paths of the radio-frequency module 1, and outputs, to the BBIC 4, the receive signals generated through the signal processing. In addition, the RFIC 3 has a controller which controls, for example, switching circuits and amplifier circuits which are included in the radio-frequency module 1. Some or all of the functions, as a controller, of the RFIC 3 may be included in a component which is present outside the RFIC 3, and may be included, for example, in the BBIC 4 or the radio-frequency module 1.

The BBIC 4 is a baseband signal processing circuit which performs signal processing using an intermediate frequency band whose frequency is lower than that of radio-frequency signals transported by the radio-frequency module 1. Signals processed by the BBIC 4 are, for example, image signals for image display and/or voice signals for calls through a speaker.

In the communication device 5 according to the present embodiment, the antenna 2 and the BBIC 4 are not necessary components.

[1.1.2 The Circuit Configuration of the Radio-Frequency Module 1]

The circuit configuration of the radio-frequency module 1 will be described. As illustrated in FIG. 1, the radio-frequency module 1 includes a power amplifier circuit 11, a low-noise amplifier circuit 21, impedance matching circuits (MNs) 41 to 44, switching circuits 51 to 55, duplexer circuits 61 and 62, a control circuit 80, the antenna connection terminal 100, radio-frequency input terminals 111 and 112, radio-frequency output terminals 121 and 122, and a control terminal 130.

The antenna connection terminal 100 is connected, outside the radio-frequency module 1, to the antenna 2.

Each of the radio-frequency input terminals 111 and 112 is an input terminal for receiving radio-frequency transmit signals from the outside of the radio-frequency module 1. In the present embodiment, the radio-frequency input terminals 111 and 112 are connected, outside the radio-frequency module 1, to the RFIC 3.

Each of the radio-frequency output terminals 121 and 122 is an output terminal for providing radio-frequency receive signals to the outside of the radio-frequency module 1. In the present embodiment, the radio-frequency output terminals 121 and 122 are connected, outside the radio-frequency module 1, to the RFIC 3.

The control terminal 130 is a terminal for transporting a control signal. That is, the control terminal 130 is a terminal for receiving a control signal from the outside of the radio-frequency module 1, and/or a terminal for supplying a control signal to the outside of the radio-frequency module 1. The control signal is related to control of an electronic component included in the radio-frequency module 1. Specifically, the control signal is a digital signal for controlling, for example, the power amplifier circuit 11.

The power amplifier circuit 11 is capable of amplifying transmit signals in Band A and Band B. The power amplifier circuit 11 is connected, at its input end, to the radio-frequency input terminals 111 and 112 through the switching circuit 52. The power amplifier circuit 11 is connected, at its output end, to transmit-filter circuits 61T and 62T through the impedance matching circuit 41 and the switching circuit 51.

According to the present embodiment, the power amplifier circuit 11, which is a multistage amplifier circuit, includes power amplifiers 11A and 11B. The power amplifier 11A corresponds to the output stage of the power amplifier circuit 11. The power amplifier 11A is connected between the power amplifier 11B and the switching circuit 51. Specifically, the power amplifier 11A is connected, at its input end, to the output end of the power amplifier 11B. The power amplifier 11A is connected, at its output end, to the impedance matching circuit 41.

The power amplifier 11B corresponds to the input stage of the power amplifier circuit 11. The power amplifier 11B is connected between the switching circuit 52 and the power amplifier 11A. Specifically, the power amplifier 11B is connected, at its input end, to the switching circuit 52. The power amplifier 11B is connected, at its output end, to the input end of the power amplifier 11A.

The configuration of the power amplifier circuit 11 is not limited to the configuration described above. For example, the power amplifier circuit 11 may be a differential amplifier circuit.

The low-noise amplifier circuit 21 is capable of amplifying receive signals in Band A and Band B. The low-noise amplifier circuit 21 is connected, at its input end, to receive-filter circuits 61R and 62R through the impedance matching circuit 42 and the switching circuit 54. The low-noise amplifier circuit 21 is connected, at its output end, to the radio-frequency output terminals 121 and 122 through the switching circuit 55.

The impedance matching circuit 41 is connected to the output end of the power amplifier circuit 11, and is connected to the input ends of the transmit-filter circuits 61T and 62T through the switching circuit 51. The impedance matching circuit 41 is capable of achieving the impedance matching between the output impedance of the power amplifier circuit 11 and the input impedance of the switching circuit 51.

The impedance matching circuit 42 is connected to the input end of the low-noise amplifier circuit 21, and is connected to the output ends of the receive-filter circuits 61R and 62R through the switching circuit 54. The impedance matching circuit 42 is capable of achieving the impedance matching between the output impedance of the switching circuit 54 and the input impedance of the low-noise amplifier circuit 21.

The impedance matching circuit 43 is connected to the output end of the transmit-filter circuit 61T and the input end of the receive-filter circuit 61R, and is connected to the antenna connection terminal 100 through the switching circuit 53. The impedance matching circuit 43 is capable of achieving the impedance matching between the switching circuit 53 and the duplexer circuit 61.

The impedance matching circuit 44 is connected to the output end of the transmit-filter circuit 62T and the input end of the receive-filter circuit 62R, and is connected to the antenna connection terminal 100 through the switching circuit 53. The impedance matching circuit 44 is capable of achieving the impedance matching between the switching circuit 53 and the duplexer circuit 62.

The switching circuit 51, which is an exemplary first switching circuit, is connected between the output end of the power amplifier circuit 11 and the input ends of the transmit-filter circuits 61T and 62T. The switching circuit 51 has terminals 511 to 513. The terminal 511 is connected to the output end of the power amplifier circuit 11 through the impedance matching circuit 41. The terminal 512 is connected to the input end of the transmit-filter circuit 61T. The terminal 513 is connected to the input end of the transmit-filter circuit 62T.

In this connection configuration, the switching circuit 51 is capable of connecting the terminal 511 to any of the terminals 512 and 513, for example, on the basis of a control signal from the RFIC 3. That is, the switching circuit 51 is capable of switching, between the transmit-filter circuits 61T and 62T, the connection to the output end of the power amplifier circuit 11. The switching circuit 51 is formed, for example, by using an SPDT (Single-Pole Double-Throw) switch, and may be called a band select switch.

The switching circuit 52, which is an exemplary second switching circuit, is connected between the radio-frequency input terminals 111 and 112 and the input end of the power amplifier circuit 11. The switching circuit 52 has terminals 521 to 523. The terminal 521 is connected to the input end of the power amplifier circuit 11. The terminals 522 and 523 are connected to the radio-frequency input terminals 111 and 112, respectively.

In this connection configuration, the switching circuit 52 is capable of connecting the terminal 521 to any of the terminals 522 and 523, for example, on the basis of a control signal from the RFIC 3. That is, the switching circuit 52 is capable of switching, between the radio-frequency input terminals 111 and 112, the connection to the input end of the power amplifier circuit 11. The switching circuit 52 is formed, for example, by using an SPDT switch, and may be called an in-switch.

The switching circuit 53, which is an exemplary third switching circuit, is connected between the antenna connection terminal 100 and the duplexer circuits 61 and 62. The switching circuit 53 has terminals 531 to 533. The terminal 531 is connected to the antenna connection terminal 100. The terminal 532 is connected to the output end of the transmit-filter circuit 61T and the input end of the receive-filter circuit 61R through the impedance matching circuit 43. The terminal 533 is connected to the output end of the transmit-filter circuit 62T and the input end of the receive-filter circuit 62R through the impedance matching circuit 44.

In this connection configuration, the switching circuit 53 is capable of connecting the terminal 531 to one or both of the terminals 532 and 533, for example, on the basis of a control signal from the RFIC 3. That is, the switching circuit 53 is capable of switching between the connection and the disconnection between the antenna connection terminal 100 and the duplexer circuit 61, and is capable of switching between the connection and the disconnection between the antenna connection terminal 100 and the duplexer circuit 62. The switching circuit 53 is formed, for example, by using a multi-connection switch, and may be called an antenna switch.

The switching circuit 54 is connected between the input end of the low-noise amplifier circuit 21 and the output ends of the receive-filter circuits 61R and 62R. The switching circuit 54 has terminals 541 to 543. The terminal 541 is connected to the input end of the low-noise amplifier circuit 21 through the impedance matching circuit 42. The terminal 542 is connected to the output end of the receive-filter circuit 61R. The terminal 543 is connected to the output end of the receive-filter circuit 62R.

In this connection configuration, the switching circuit 54 is capable of connecting the terminal 541 to any of the terminals 542 and 543, for example, on the basis of a control signal from the RFIC 3. That is, the switching circuit 54 is capable of switching, between the receive-filter circuits 61R and 62R, the connection to the input end of the low-noise amplifier circuit 21. The switching circuit 54 is formed, for example, by using an SPDT switch.

The switching circuit 55 is connected between the radio-frequency output terminals 121 and 122 and the output end of the low-noise amplifier circuit 21. The switching circuit 55 has terminals 551 to 553. The terminal 551 is connected to the output end of the low-noise amplifier circuit 21. The terminals 552 and 553 are connected to the radio-frequency output terminals 121 and 122, respectively.

In this connection configuration, the switching circuit 55 is capable of connecting the terminal 551 to any of the terminals 552 and 553, for example, on the basis of a control signal from the RFIC 3. That is, the switching circuit 55 is capable of switching, between the radio-frequency output terminals 121 and 122, the connection to the output end of the low-noise amplifier circuit 21. The switching circuit 55 is formed, for example, by using an SPDT switch, and may be called an out-switch.

The duplexer circuit 61 is capable of passing radio-frequency signals in Band A. The duplexer circuit 61 transports transmit signals and receive signals in Band A by using an FDD (Frequency Division Duplex) system. The duplexer circuit 61 includes the transmit-filter circuit 61T and the receive-filter circuit 61R.

The transmit-filter circuit 61T (A-Tx) has a passband including the uplink operating band of Band A. Thus, the transmit-filter circuit 61T is capable of passing transmit signals in Band A. The transmit-filter circuit 61T is connected between the power amplifier circuit 11 and the antenna connection terminal 100. Specifically, the transmit-filter circuit 61T is connected, at its input end, to the output end of the power amplifier circuit 11 through the switching circuit 51 and the impedance matching circuit 41. In contrast, the transmit-filter circuit 61T is connected, at its output end, to the antenna connection terminal 100 through the impedance matching circuit 43 and the switching circuit 53.

The receive-filter circuit 61R (A-Rx) has a passband including the downlink operating band of Band A. Thus, the receive-filter circuit 61R is capable of passing receive signals in Band A. The receive-filter circuit 61R is connected between the antenna connection terminal 100 and the low-noise amplifier circuit 21. Specifically, the receive-filter circuit 61R is connected, at its input end, to the antenna connection terminal 100 through the impedance matching circuit 43 and the switching circuit 53. In contrast, the receive-filter circuit 61R is connected, at its output end, to the low-noise amplifier circuit 21 through the switching circuit 54 and the impedance matching circuit 42.

The duplexer circuit 62 is capable of passing radio-frequency signals in Band B. The duplexer circuit 62 transports transmit signals and receive signals in Band B by using an FDD system. The duplexer circuit 62 includes the transmit-filter circuit 62T and the receive-filter circuit 62R.

The transmit-filter circuit 62T (B-Tx) has a passband including the uplink operating band of Band B. Thus, the transmit-filter circuit 62T is capable of passing transmit signals in Band B. The transmit-filter circuit 62T is connected between the power amplifier circuit 11 and the antenna connection terminal 100. Specifically, the transmit-filter circuit 62T is connected, at its input end, to the output end of the power amplifier circuit 11 through the switching circuit 51 and the impedance matching circuit 41. In contrast, the transmit-filter circuit 62T is connected, at its output end, to the antenna connection terminal 100 through the impedance matching circuit 44 and the switching circuit 53.

The receive-filter circuit 62R (B-Rx) has a passband including the downlink operating band of Band B. Thus, the receive-filter circuit 62R is capable of passing receive signals in Band B. The receive-filter circuit 62R is connected between the antenna connection terminal 100 and the low-noise amplifier circuit 21. Specifically, the receive-filter circuit 62R is connected, at its input end, to the antenna connection terminal 100 through the impedance matching circuit 44 and the switching circuit 53. In contrast, the receive-filter circuit 62R is connected, at its output end, to the low-noise amplifier circuit 21 through the switching circuit 54 and the impedance matching circuit 42.

The control circuit 80 is a power amplifier controller which controls the power amplifier circuit 11. The control circuit 80 receives a control signal from the RFIC 3 through the control terminal 130, and outputs a control signal to the power amplifier circuit 11.

One or more circuits among the circuits illustrated in FIG. 1 are not necessarily included in the radio-frequency module 1. For example, the radio-frequency module 1 may have any configuration as long as the radio-frequency module 1 includes at least the power amplifier circuit 11 and electric circuits (for example, the control circuit 80 and the like), and the radio-frequency module 1 does not necessarily include the other circuits.

[1.2 The Component Layout of the Radio-Frequency Module 1]

An exemplary component layout of the radio-frequency module 1 having the configuration described above will be described specifically by referring to FIGS. 2 and 3.

Figure 2:
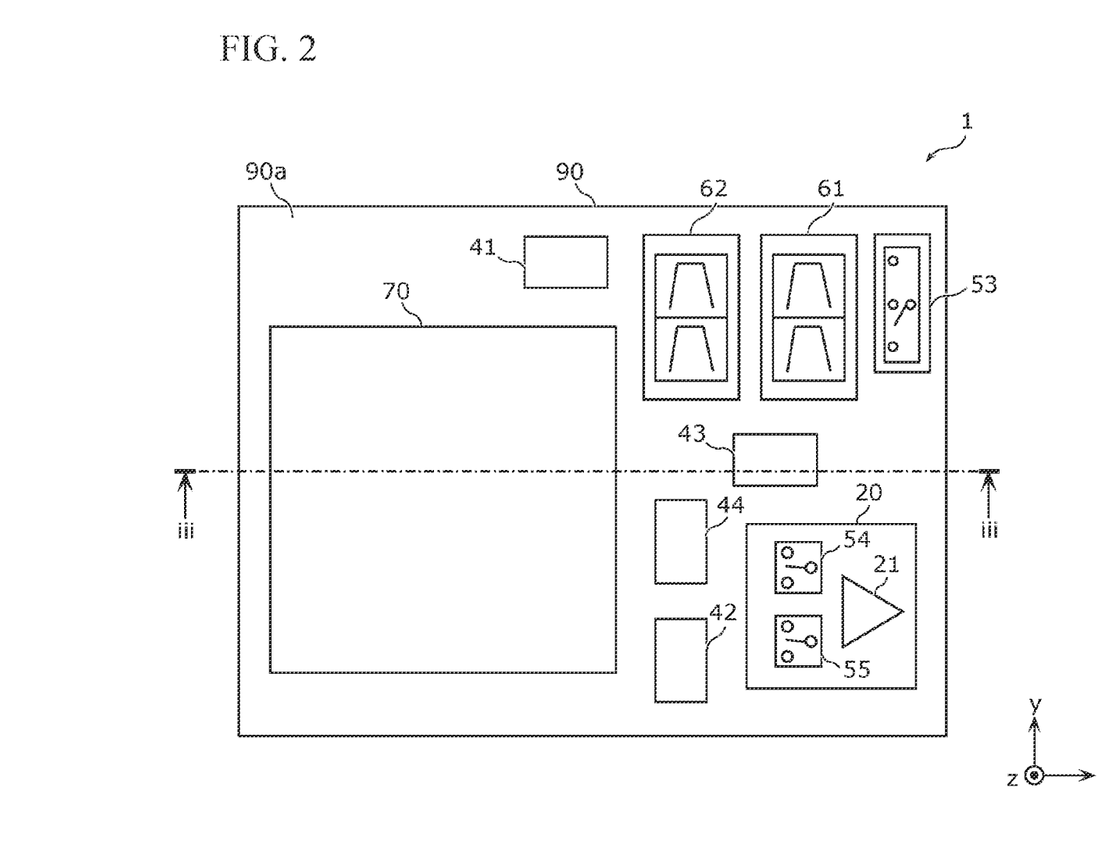
FIG. 2 is a plan view of a radio-frequency module according to an embodiment.

FIG. 2 is a plan view of the radio-frequency module 1 according to the embodiment. FIG. 3 is a cross-sectional view of the radio-frequency module 1 according to the embodiment. The cross section of the radio-frequency module 1 in FIG. 3 corresponds to the cross section along line iii-iii in FIG. 2.

In addition to the components included in the circuit illustrated in FIG. 1, the radio-frequency module 1 further includes a module substrate 90, a resin member 91, a shield electrode layer 92, and multiple external connection terminals 150. In FIG. 2, the resin member 91 and the shield electrode layer 92 are not illustrated. In FIGS. 2 and 3, wiring connecting, to each other, components disposed on the module substrate 90 is not illustrated.

The module substrate 90 has principal surfaces 90a and 90b which are opposite to each other. In the present embodiment, the module substrate 90 is rectangular in plan view, but the shape of the module substrate 90 is not limited to this. The module substrate 90 may be, for example, an LTCC (Low Temperature Co-fired Ceramics) substrate or an HTCC (High Temperature Co-fired Ceramics) substrate, which has a layered structure of multiple dielectric layers, a component-embedded substrate, a substrate having an RDL (Redistribution Layer), or a printed board. However, the module substrate 90 is not limited to these.

Integrated circuits 20 and 70, the impedance matching circuits 41 to 44, the switching circuit 53, and the duplexer circuits 61 and 62 are disposed on the principal surface 90a. The principal surface 90a and the components on the principal surface 90a are covered by the resin member 91.

The integrated circuit 20 includes the low-noise amplifier circuit 21 and the switching circuits 54 and 55. The integrated circuit 20 may be formed, for example, by using a CMOS (Complementary Metal Oxide Semiconductor), and may be specifically manufactured through SOI (Silicon on Insulator) process. This enables the integrated circuit 20 to be manufactured at a low cost. The integrated circuit 20 may be formed of at least one of the following materials: gallium arsenide; silicon germanium (SiGe); and gallium nitride (GaN). This enables a high-quality low-noise amplifier circuit 21 and high-quality switching circuits 54 and 55 to be implemented.

The integrated circuit 70 includes a first base 71 and a second base 72. The second base 72 and the first base 71 are laminated in this sequence on the principal surface 90a of the module substrate 90. The details of the integrated circuit 70 will be described below by using FIGS. 4 to 6.

Each of the impedance matching circuits 41 to 44 includes a matching device. The matching device may be an inductor and/or a capacitor. Each of the matching devices included in the impedance matching circuits 41 to 44 is formed by using an SMD (Surface Mount Device). Some or all of the matching devices included in the impedance matching circuits 41 to 44 may be formed by using an IPD (Integrated Passive Device).

The switching circuit 53 is formed, for example, by using multiple MOSFETs (Metal-Oxide-Semiconductor Field-Effect Transistors) which are connected to each other in series. The number of stages in series connection of the MOSFETs may be any as long as the number is determined in accordance with a required withstand voltage, and has no particular limitation.

Each of the duplexer circuits 61 and 62 may be formed, for example, by using any of a SAW (Surface Acoustic Wave) filter, a BAW (Bulk Acoustic Wave) filter, an LC resonant filter, and a dielectric filter. Further, the configuration is not limited to these.

The resin member 91 covers the principal surface 90a and the components on the principal surface 90a. The resin member 91 has a function of ensuring the reliability of mechanical strength, moisture resistance, and the like of the components on the principal surface 90a. The resin member 91 is not a necessary component.

The shield electrode layer 92, which is, for example, a thin metal film formed by using a sputtering method, is formed so as to cover the top surface and the side surfaces of the resin member 91 and the side surfaces of the module substrate 90. The shield electrode layer 92 is set to the ground potential, and suppresses the invasion of external noise into the components included in the radio-frequency module 1.

The external connection terminals 150 are disposed on the principal surface 90b. The external connection terminals 150 include the antenna connection terminal 100, the radio-frequency input terminals 111 and 112, the radio-frequency output terminals 121 and 122, and the control terminal 130 which are illustrated in FIG. 1, as well as ground terminals. Each of the external connection terminals 150 is joined, for example, to an input/output terminal and/or a ground terminal on a mother board disposed in the z-axis negative direction of the radio-frequency module 1. The external connection terminals 150 may be, for example, bump electrodes, but the configuration is not limited to this.

Figure 3:
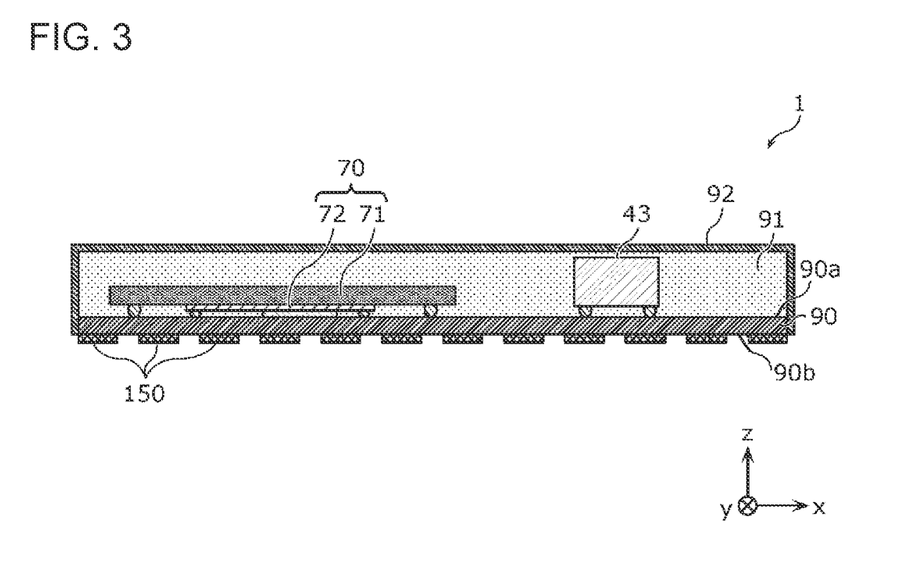
FIG. 3 is a cross-sectional view of a radio-frequency module according to an embodiment.

The component layout illustrated in FIGS. 2 and 3 is exemplary, and the layout is not limited to this. For example, some or all of the components may be disposed on the principal surface 90b of the module substrate 90. In this case, the principal surface 90b and the components on the principal surface 90b may be covered by a resin member.

[1.3 The Configuration of the Integrated Circuit 70]

Figure 4:
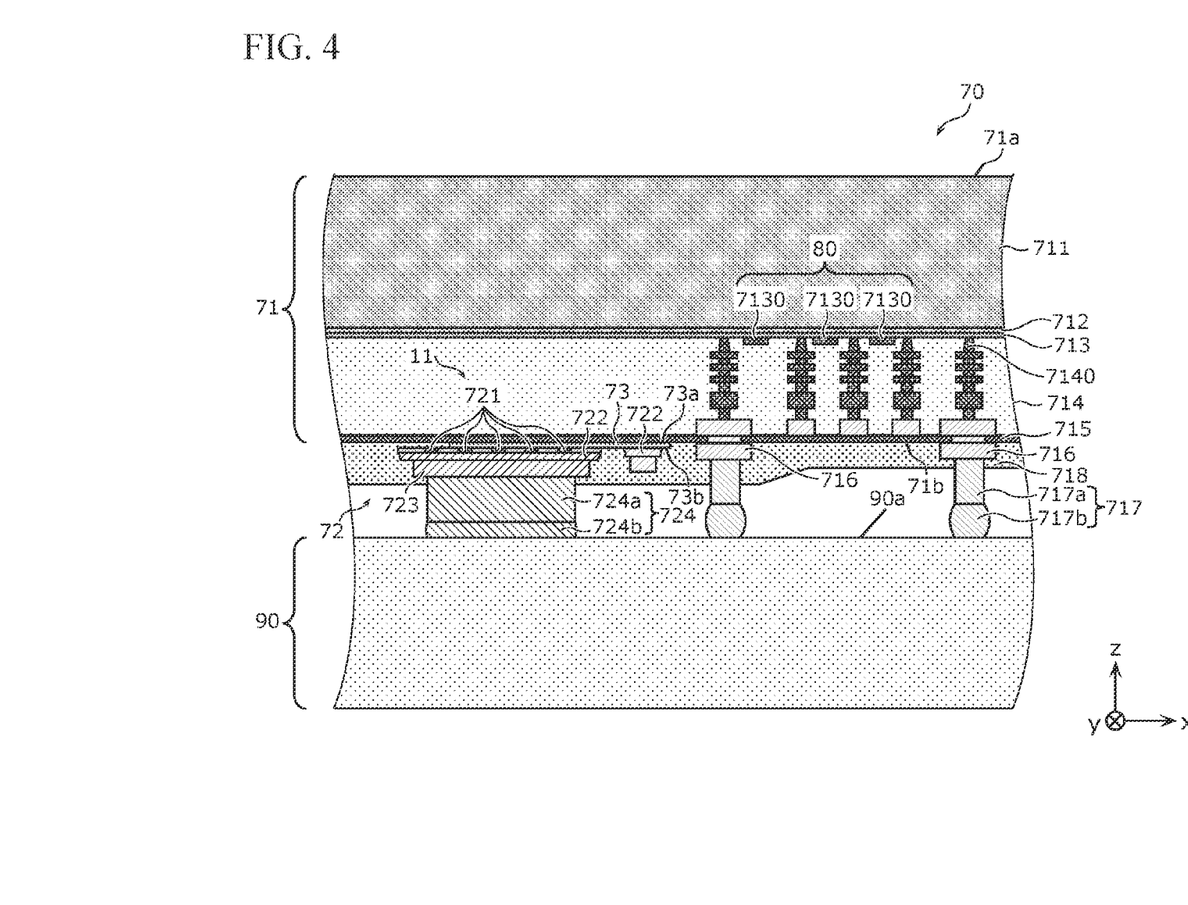
FIG. 4 is a partial cross-sectional view of a radio-frequency module according to an embodiment.
Figure 5:
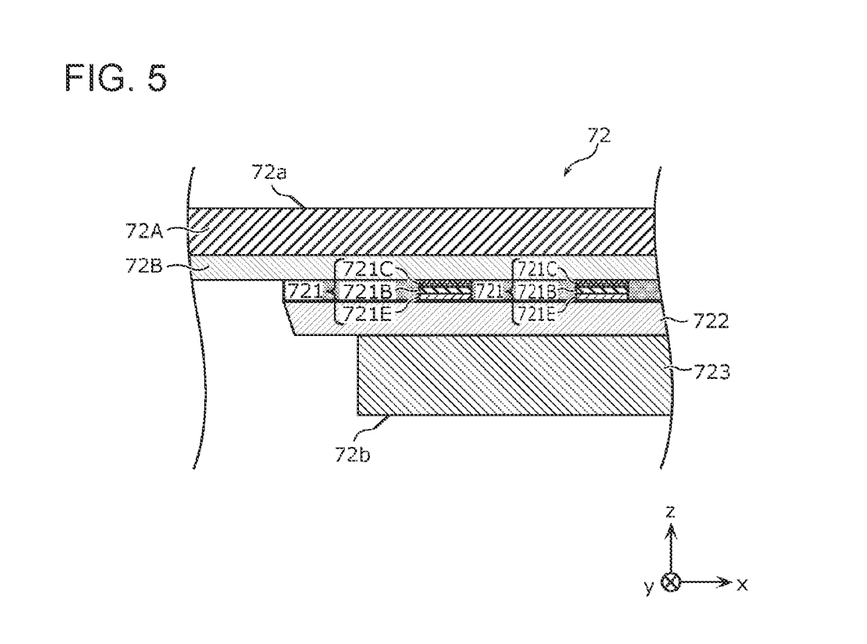
FIG. 5 is a partial cross-sectional view of a radio-frequency module according to an embodiment.
Figure 6:
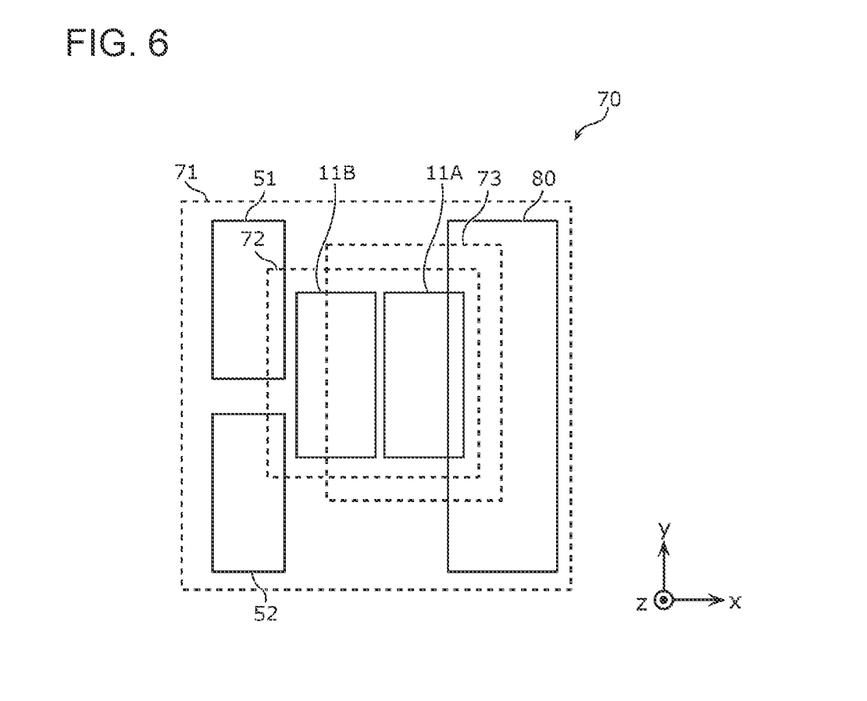
FIG. 6 is a diagram illustrating the circuit layout in an integrated circuit according to an embodiment.

The configuration of the integrated circuit 70 will be described by referring to FIGS. 4 to 6. FIGS. 4 and 5 are partial cross-sectional views of the radio-frequency module 1 according to the embodiment. FIG. 6 is a diagram illustrating the circuit layout in the integrated circuit 70 according to the embodiment. Specifically, FIG. 4 is an enlarged cross-sectional view of the integrated circuit 70. FIG. 5 is an enlarged cross-sectional view of the second base 72. FIG. 6 is a perspective plan view of the integrated circuit 70. In FIGS. 4 to 6, not all the wiring and electrodes are illustrated. In FIG. 6, the broken lines indicate the outlines of the first base 71, the second base 72, and a high thermal conductive member 73.

As illustrated in FIG. 4, the integrated circuit 70 includes the first base 71, the second base 72, and the high thermal conductive member 73.

[1.3.1 The Configuration of the First Base 71]

The first base 71 will be described. At least a part of the first base 71 is formed of a first semiconductor material. In this example, the first semiconductor material is silicon (Si). The first semiconductor material is not limited to silicon. For example, the first semiconductor material may be a material containing, as the main component, any of gallium arsenide, aluminum arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) ($Ga_2O_3$), or a material containing, as the main component, a multicomponent mixed-crystal material composed of more than one of these materials. However, the first semiconductor material is not limited to these.

The switching circuits 51 and 52 and the control circuit 80 are formed in the first base 71. The electric circuits formed in the first base 71 are not limited to the switching circuits 51 and 52 and the control circuit 80. For example, only either one or some of the switching circuits 51 and 52 and the control circuit 80 may be formed in the first base 71. In addition, a control circuit (not illustrated) which controls the switching circuit 51 and/or the switching circuit 52 may be formed in the first base 71. In addition, at least one of the impedance matching circuits 41 to 44 may be formed in the first base 71.

As illustrated in FIG. 4, the first base 71 has surfaces 71a and 71b which are opposite to each other. The surface 71b, which is an exemplary third surface, is in contact with the high thermal conductive member 73.

The first base 71 includes a silicon substrate 711, a silicon dioxide ($SiO_2$) layer 712, a silicon layer 713, a silicon dioxide layer 714, and a silicon nitride (SiN) layer 715. The silicon dioxide layer 712, the silicon layer 713, the silicon dioxide layer 714, and the silicon nitride layer 715 are laminated on the silicon substrate 711 in this sequence.

The silicon substrate 711 is formed, for example, of a silicon single crystal, and is used as a support substrate.

The silicon dioxide layer 712 is disposed on the silicon substrate 711, and is used as an insulating layer.

The silicon layer 713 is disposed on the silicon dioxide layer 712, and is used as a device layer. In the cross section in FIG. 4, multiple circuit devices 7130 which are included in the control circuit 80 are formed on the silicon layer 713.

The silicon dioxide layer 714 is disposed on the silicon layer 713, and is used as a wiring forming layer. In the silicon dioxide layer 714, wiring for connecting the control circuit 80 and the switching circuits 51 and 52, which are formed on the silicon layer 713, to electrodes 716, which are formed on a surface of the silicon nitride layer 715, is formed. This wiring includes multiple interconnect layers (not illustrated), and multiple via electrodes 7140 which connect the interconnect layers to each other. The interconnect layers and the via electrodes 7140 are formed, for example, of copper or aluminum.

The silicon nitride layer 715 is disposed on the silicon dioxide layer 714, and is used as a passivation layer. The electrodes 716 are formed as a redistribution layer on a part of a surface of the silicon nitride layer 715. The second base 72 and the high thermal conductive member 73 are joined to another part of the surface of the silicon nitride layer 715.

The electrodes 716 are joined to electrodes (not illustrated), which are disposed on the module substrate 90, with the electrodes 717 interposed in between. The surfaces of the electrodes 716 are coated by a resin layer 718 which is an insulating film.

The electrodes 717 are exemplary first electrodes. Each of the electrodes 717 is an electrode which protrudes from the first base 71 toward the principal surface 90a of the module substrate 90, and is joined, at its leading end, to the principal surface 90a. Each of the electrodes 717 has a columnar conductor 717a and a bump electrode 717b. The bump electrode 717b is joined to an electrode (not illustrated) disposed on the principal surface 90a of the module substrate 90.

The first base 71 is not limited to the configuration in FIG. 4. For example, the first base 71 does not necessarily include one or some of the layers on the silicon substrate 711.

[1.3.2 The Configuration of the Second Base 72]

The second base 72 will be described. At least a part of the second base 72 is formed of a second semiconductor material having a thermal conductivity lower than the first semiconductor material. The second semiconductor material is gallium arsenide. The second semiconductor material is not limited to gallium arsenide. For example, the second semiconductor material may be a material containing, as the main component, any of gallium arsenide, aluminum arsenide, indium arsenide, indium phosphide, gallium phosphide, indium antimonide, gallium nitride, indium nitride, aluminum nitride, silicon germanium, silicon carbide, gallium oxide (III), and gallium bismuth (GaBi), or a material containing, as the main component, a multicomponent mixed-crystal material composed of more than one of these materials. The second semiconductor material is not limited to these.

The power amplifier circuit 11 is formed in the second base 72. Specifically, multiple circuit devices 721, as well as electrodes (not illustrated) for applying voltages to the circuit devices 721 or electrodes (not illustrated) for supplying currents, are formed in the second base 72. The circuit devices 721 form, for example, heterojunction bipolar transistors (HBTs) in which multiple unit transistors are connected to each other in parallel, and are included in the power amplifier circuit 11.

As illustrated in FIG. 5, the second base 72 has surfaces 72a and 72b which are opposite to each other. The surface 72a, which is an exemplary fourth surface, is in contact with the high thermal conductive member 73. The surface 72b, which is an exemplary fifth surface, is on the opposite side of the surface 72a. An electrode 724 is disposed on the surface 72b.

The second base 72 includes a semiconductor layer 72A, an epitaxial layer 72B formed on a surface of the semiconductor layer 72A, and the circuit devices 721, and electrodes 722 and 723. The semiconductor layer 72A is formed of the second semiconductor material, and is joined to the silicon nitride layer 715 of the first base 71. The semiconductor layer 72A is, for example, a GaAs layer. Each circuit device 721 has a collector layer 721C, a base layer 721B, and an emitter layer 721E. The collector layer 721C, the base layer 721B, and the emitter layer 721E are laminated on the epitaxial layer 72B in this sequence. That is, in each circuit device 721, the collector layer 721C, the base layer 721B, and the emitter layer 721E are laminated in this sequence from the first base 71 side.

For example, the collector layer 721C is formed of n-gallium arsenide. The base layer 721B is formed of p-gallium arsenide. The emitter layer 721E is formed of n-indium gallium phosphorus (InGaP). The emitter layer 721E is joined to an electrode 723 with an electrode 722 which is interposed in between and which is formed on the surface of the second base 72. The electrode 723 is joined to the principal surface 90a of the module substrate 90 with the electrode 724 interposed in between.

The electrode 724, which is an exemplary second electrode, protrudes from the second base 72 toward the principal surface 90a of the module substrate 90, and is joined, at its leading end, to the principal surface 90a. The electrode 724 functions as a thermal-radiation path for heat generated by the power amplifier circuit 11. The electrode 724 has a columnar conductor 724a and a bump electrode 724b. The bump electrode 724b is joined to an electrode (not illustrated) disposed on the principal surface 90a of the module substrate 90.

The configuration of the second base 72 is not limited to that in FIGS. 4 and 5.

[1.3.3 The Configuration of the High Thermal Conductive Member 73]

The high thermal conductive member 73 will be described. At least a part of the high thermal conductive member 73 is formed of a high thermal conductive material having a thermal conductivity higher than the first semiconductor material. In this example, the high thermal conductive material is a metal (such as copper). Therefore, the high thermal conductive member 73 includes a metal member. At that time, the metal member is connected to the ground, but is connected, in the integrated circuit 70, to none of the power amplifier circuit 11, the control circuit 80, and the switching circuits 51 and 52.

The high thermal conductive member 73 is disposed between an electric circuit (for example, the control circuit 80 or the switching circuit 51 or 52), which is formed in the first base 71, and the power amplifier circuit 11, which is formed in the second base 72. In addition, at least a part of the high thermal conductive member 73 overlaps at least a part of the first base 71 and at least a part of the second base 72 in plan view. Further, the high thermal conductive member 73 is in contact with both the first base 71 and the second base 72.

Specifically, the high thermal conductive member 73 has surfaces 73a and 73b. The surface 73a, which is an exemplary first surface, is in contact with the surface 71b of the first base 71. The surface 73b, which is an exemplary second surface, is on the opposite side of the surface 73a, and is in contact with the surface 72a of the second base 72. In this example, the high thermal conductive member 73 is a sheet-like or layered member which is interposed between the surface 71b of the first base 71 and the surface 72a of the second base 72.

The high thermal conductive material is limited to neither a metal nor copper. The high thermal conductive member 73 is not necessarily connected to the ground. The shape of the high thermal conductive member 73 is not limited to a sheet-like shape. For example, the high thermal conductive member 73 may be shaped like a block. In addition, the high thermal conductive member 73 may include multiple layers. In this case, the high thermal conductive member 73 may have any configuration as long as at least one of the layers is formed of the high thermal conductive material.

[1.3.4 The Circuit Layout in the Integrated Circuit 70]

The circuit layout in the integrated circuit 70 in plan view will be described by referring to FIG. 6.

As illustrated in FIG. 6, a part of the power amplifier circuit 11 formed in the second base 72 overlaps a part of the high thermal conductive member 73 in plan view. Specifically, a transistor (not illustrated) included, as an amplifying device, in the power amplifier circuit 11 overlaps a part of the high thermal conductive member 73 in plan view. More specifically, a transistor (that is, the output-stage transistor) included, as an amplifying device, in the power amplifier 11A overlaps a part of the high thermal conductive member 73 in plan view. In addition, a part of the control circuit 80 formed in the first base 71 also overlaps a part of the high thermal conductive member 73 in plan view.

The circuit layout, in FIG. 6, in the integrated circuit 70 is merely exemplary, and the circuit layout is not limited to this layout. For example, the high thermal conductive member 73 does not necessarily overlap the power amplifier circuit 11 and/or the control circuit 80 in plan view. In addition, the high thermal conductive member 73 may overlap the switching circuits 51 and 52 in plan view.

[1.4 Effects and the Like]

As described above, the integrated circuit 70 according to the present embodiment includes the first base 71, which has at least a part formed of the first semiconductor material and which includes an electric circuit(s) (for example, the control circuit 80 or the switching circuit 51 or 52), the second base 72, which has at least a part formed of the second semiconductor material having a thermal conductivity lower than the first semiconductor material and which includes the power amplifier circuit 11, and the high thermal conductive member 73, which has at least a part formed of the high thermal conductive material having a thermal conductivity higher than the first semiconductor material and which is disposed between the electric circuit(s) and the power amplifier circuit 11. At least a part of the high thermal conductive member 73 overlaps at least a part of the first base 71 and at least a part of the second base 72 in plan view. The high thermal conductive member 73 is in contact with the first base 71 and the second base 72.

According to this configuration, the first base 71, in which the electric circuit(s) is formed, overlaps the second base 72, in which the power amplifier circuit 11 is formed, in plan view. Thus, the integrated circuit 70 achieves the contribution to a reduction in size of the radio-frequency module 1. Further, the heat generated by the power amplifier circuit 11 formed in the second base 72 may be discharged to the first base 71 which is formed of the first semiconductor material having a thermal conductivity higher than the second semiconductor material of which the second base 72 is formed. In this state, the high thermal conductive member 73 having a high thermal conductivity is in contact, between the first base 71 and the second base 72, with both the bases, allowing heat in the second base 72 to be efficiently discharged through the high thermal conductive member 73 to the first base 71. Therefore, the integrated circuit 70 achieves the suppression of the degradation of the characteristics of the power amplifier circuit 11 due to the heat.

In addition, for example, in the integrated circuit 70 according to the present embodiment, the high thermal conductive member 73 may have the surface 73a, which is in contact with the first base 71, and the surface 73b, which is on the opposite side of the surface 73a and which is in contact with the second base 72.

According to this configuration, the high thermal conductive member 73 is in contact with the first base 71 and the second base 72 on the surfaces 73a and 73b, allowing the contact area with the first base 71 and the contact area with the second base 72 to be easily increased. That is, the area for heat transfer from the second base 72 to the high thermal conductive member 73 and the area for heat transfer from the high thermal conductive member 73 to the first base 71 may be easily increased. Therefore, the heat may be more efficiently discharged from the second base 72, and the degradation of the characteristics of the power amplifier circuit 11 due to the heat may be further suppressed.

In addition, for example, in the integrated circuit 70 according to the present embodiment, at least a part of the high thermal conductive member 73 may overlap at least a part of the power amplifier circuit 11 in plan view.

According to this configuration, a heat-transfer path from the power amplifier circuit 11 to the high thermal conductive member 73 may be shortened. Therefore, the heat generated by the power amplifier circuit 11 may be more efficiently discharged from the second base 72, and the degradation of the characteristics of the power amplifier circuit 11 due to the heat may be further suppressed.

In addition, for example, in the integrated circuit 70 according to the present embodiment, the power amplifier circuit 11 may include a transistor as an amplifying device. At least a part of the high thermal conductive member 73 may overlap at least a part of the transistor in plan view.

According to this configuration, a heat-transfer path from the transistor of the power amplifier circuit 11 to the high thermal conductive member 73 may be shortened. Therefore, the heat generated by the transistor may be more efficiently discharged from the second base 72, and the degradation of the characteristics of the power amplifier circuit 11 due to the heat may be further suppressed.

In addition, for example, in the integrated circuit 70 according to the present embodiment, the power amplifier circuit 11 may be a multistage amplifier circuit, and the transistor may be an output-stage transistor.

According to this configuration, a heat-transfer path from the output-stage transistor, which generates more heat, to the high thermal conductive member 73 may be shortened. Therefore, the heat generated by the output-stage transistor may be more efficiently discharged from the second base 72, and the degradation of the characteristics of the power amplifier circuit 11 due to the heat may be further suppressed.

In addition, for example, in the integrated circuit 70 according to the present embodiment, the first base 71 may have the surface 71b, which is in contact with the surface 73a of the high thermal conductive member 73, and the electrodes 717, which are disposed on the surface 71b.

According to this configuration, the heat in the first base 71 may be discharged to the module substrate 90 through the electrodes 717, achieving the improvement of the heat dissipation of the integrated circuit 70.

In addition, for example, in the integrated circuit 70 according to the present embodiment, the second base 72 may have the surface 72a, which is in contact with the face 73b of the high thermal conductive member 73, the surface 72b, which is on the opposite side of the surface 72a, and the electrode 724, which is disposed on the surface 72b.

According to this configuration, the heat may be discharged from the surface 72b, which is on the opposite side of the face 72a which is in contact with the high thermal conductive member 73, of the second base 72 through the electrode 724 to the module substrate 90, achieving the improvement of the heat dissipation of the integrated circuit 70.

In addition, for example, in the integrated circuit 70 according to the present embodiment, at least a part of the electrode 724 may overlap at least a part of the power amplifier circuit 11 in plan view.

According to this configuration, a heat-transfer path from the power amplifier circuit 11 through the electrode 724 to the module substrate 90 may be shortened. Therefore, the heat generated by the power amplifier circuit 11 may be more efficiently discharged from the second base 72, and the degradation of the characteristics of the power amplifier circuit 11 due to heat may be further suppressed.

In addition, for example, in the integrated circuit 70 according to the present embodiment, the power amplifier circuit 11 may include a transistor as an amplifying device, and at least a part of the electrode 724 may overlap at least a part of the transistor in plan view.

According to this configuration, a heat-transfer path from the transistor of the power amplifier circuit 11 through the electrode 724 to the module substrate 90 may be shortened. Therefore, the heat generated by the transistor of the power amplifier circuit 11 may be more efficiently discharged from the second base 72, and the degradation of the characteristics of the power amplifier circuit 11 due to heat may be further suppressed.

In addition, for example, in the integrated circuit 70 according to the present embodiment, the power amplifier circuit 11 may be a multistage amplifier circuit, and the transistor may be an output-stage transistor.

According to this configuration, a heat-transfer path from the output-stage transistor, which generates more heat, of the power amplifier circuit 11 through the electrode 724 to the module substrate 90 may be shortened. Therefore, the heat generated by the output-stage transistor of the power amplifier circuit 11 may be more efficiently discharged from the second base 72, and the degradation of the characteristics of the power amplifier circuit 11 due to the heat may be further suppressed.

In addition, for example, in the integrated circuit 70 according to the present embodiment, the high thermal conductive material may be a metal.

According to this configuration, an effect, caused by the high thermal conductive member 73, of blocking out noise may be improved.

In addition, for example, in the integrated circuit 70 according to the present embodiment, the high thermal conductive member 73 may be connected to the ground.

According to this configuration, the effect, caused by the high thermal conductive member 73, of blocking out noise may be further improved.

In addition, for example, in the integrated circuit 70 according to the present embodiment, at least a part of the high thermal conductive member 73 may overlap at least a part of each of the electric circuit(s) in plan view.

According to this configuration, the isolation between the electric circuit(s), which is formed in the first base 71, and the power amplifier circuit 11, which is formed in the second base 72, may be improved, achieving the improvement of the electrical characteristics of the integrated circuit 70.

In addition, for example, in the integrated circuit 70 according to the present embodiment, the high thermal conductive member 73 may be connected, in the integrated circuit 70, to neither the power amplifier circuit 11 nor the electric circuit(s).

According to this configuration, a reduction of the isolation between the power amplifier circuit 11 and the electric circuit(s) may be suppressed through the high thermal conductive member 73.

In addition, for example, in the integrated circuit 70 according to the present embodiment, the electric circuit(s) may include at least one of the following circuits: the control circuit 80 which controls the power amplifier circuit 11; the switching circuit 51 which is connected to the output end of the power amplifier circuit 11; and the switching circuit 52 which is connected to the input end of the power amplifier circuit 11.

According to this configuration, at least one of the circuits, the control circuit 80 and the switching circuits 51 and 52 which are connected to the power amplifier circuit 11 formed in the second base 72, is formed in the first base 71. Thus, the wiring length between the power amplifier circuit 11 and the at least one of the circuits, the control circuit 80 and the switching circuits 51 and 52, may be decreased. This achieves a reduction of the influence of digital noise due to a control signal, and achieves a reduction of wiring loss and mismatching loss due to the stray capacitance of wiring.

In addition, for example, in the integrated circuit 70 according to the present embodiment, the first semiconductor material may be silicon, and the second semiconductor material may be gallium arsenide.

According to this configuration, the first semiconductor material may be silicon, enabling the first base 71, having a relatively high thermal conductivity, to be manufactured at a relatively low cost. In addition, the second semiconductor material may be gallium arsenide, enabling a relatively high-performance power amplifier circuit 11 to be manufactured.

In addition, for example, in the integrated circuit 70 according to the present embodiment, the high thermal conductive material may be copper.

According to this configuration, the high thermal conductive material may be copper, achieving the high thermal conductive member 73 having a high thermal conductivity.

In addition, for example, in the integrated circuit 70 according to the present embodiment, the power amplifier circuit 11 may include the circuit devices 721, each of which has the collector layer 721C, the base layer 721B, and the emitter layer 721E. The collector layer 721C, the base layer 721B, and the emitter layer 721E may be laminated in this sequence from the first base 71 side.

According to this configuration, wiring, to which each of the collector layer 721C, the base layer 721B, and the emitter layer 721E is connected, may be easily made in a manufacturing process. In addition, the area of the collector layer 721C is larger than the area of each of the base layer 721B and the emitter layer 721E in plan view. Therefore, joining the collector layer 721C to the first base 71 enables the joint area to be increased compared with the case in which the base layer 721B or the emitter layer 721E is joined to the first base 71. As a result, the joint between the first base 71 and the second base 72 is strengthened, achieving the suppression of the state in which the second base 72 peels off from the first base 71.

The integrated circuit 70 according to the present embodiment includes the first base 71, which has at least a part formed of silicon or gallium nitride and which includes an electric circuit(s) (for example, the control circuit 80 or the switching circuit 51 or 52), the second base 72, which has at least a part formed of gallium arsenide or silicon germanium and which includes the power amplifier circuit 11, and the high thermal conductive member 73, which has at least a part formed of copper and which is disposed between the electric circuit(s) and the power amplifier circuit 11. At least a part of the high thermal conductive member 73 overlaps at least a part of the first base 71 and at least a part of the second base 72 in plan view. The high thermal conductive member 73 is in contact with the first base 71 and the second base 72.

According to this configuration, the first base 71, in which the electric circuit(s) are formed, overlaps the second base 72, in which the power amplifier circuit 11 is formed, in plan view. Thus, the integrated circuit 70 achieves the contribution to a reduction in size of the radio-frequency module 1. Further, the heat generated by the power amplifier circuit 11 formed in the second base 72 may be discharged to the first base 71 which is formed of silicon or gallium nitride having a thermal conductivity higher than gallium arsenide or silicon germanium of which the second base 72 is formed. In this state, the high thermal conductive member 73, which is formed of copper having a high thermal conductivity, is in contact, between the first base 71 and the second base 72, with both the bases. This enables the heat in the second base 72 to be efficiently discharged to the first base 71 through the high thermal conductive member 73. Therefore, the integrated circuit 70 achieves the suppression of the degradation of the characteristics of the power amplifier circuit 11 due to the heat.

The radio-frequency module 1 according to the present embodiment includes the module substrate 90, having the principal surface 90*a*, and the integrated circuit 70 disposed on the principal surface 90*a*. The first base 71 is joined to the principal surface 90*a* with the electrodes 717 interposed in between. The second base 72 is joined to the principal surface 90*a* with the electrode 724 interposed in between.

According to this configuration, the heat generated by the power amplifier circuit 11 formed in the second base 72 may be effectively discharged to the module substrate 90 through the first base 71, which is formed of the first semiconductor material having a thermal conductivity higher than the second semiconductor material of which the second base 72 is formed, and the electrodes 717. In this state, the high thermal conductive member 73, having a high thermal conductivity, is in contact, between the first base 71 and the second base 72, with both the bases, enabling the heat in the second base 72 to be efficiently discharged to the module substrate 90 through the high thermal conductive member 73, the first base 71, and the electrodes 717.

The communication device 5 according to the present embodiment includes the RFIC 3, which processes radio-frequency signals, and the radio-frequency module 1, which transports radio-frequency signals between the RFIC 3 and the antenna 2.

According to this configuration, the communication device 5 may have substantially the same effects as those of the radio-frequency module 1.

Other Embodiments

An integrated circuit and a radio-frequency module which are provided by the present disclosure are described on the basis of the embodiment. The integrated circuit and the radio-frequency module, which are provided by the present disclosure, are not limited to the embodiment described above. Other embodiments, which are embodied by combining any components in the embodiment, modified examples, which are obtained by making, on the embodiment, various changes conceived by those skilled in the art without departing from the gist of the present disclosure, and various devices, in which the radio-frequency module is built, are also encompassed in the present disclosure.

The present disclosure may be widely used as a radio-frequency module, which is disposed in a front-end unit, in communication devices such as a cellular phone.

1 radio-frequency module
  2 antenna
  3 RFIC
  4 BBIC
  5 communication device
 11 power amplifier circuit
 11A, 11B power amplifier
 20, 70 integrated circuit
 21 low-noise amplifier circuit
 41, 42, 43, 44 impedance matching circuit
 51, 52, 53, 54, 55 switching circuit
 61, 62 duplexer circuit
 61R, 62R receive-filter circuit
 61T, 62T transmit-filter circuit
 71 first base
 71*a*, 71*b*, 72*a*, 72*b*, 73*a*, 73*b* surface
 72 second base
 72A semiconductor layer
 72B epitaxial layer
 73 high thermal conductive member
 80 control circuit
 90 module substrate
 90*a*, 90*b* principal surface
 91 resin member
 92 shield electrode layer
100 antenna connection terminal
111, 112 radio-frequency input terminal
121, 122 radio-frequency output terminal
130 control terminal
150 external connection terminal
711 silicon substrate
712, 714 silicon dioxide layer
713 silicon layer
715 silicon nitride layer
716, 717, 722, 723, 724 electrode
717*a*, 724*a* columnar conductor
717*b*, 724*b* bump electrode
718 resin layer
721, 7130 circuit device
721B base layer
721C collector layer
721E emitter layer
7140 via electrode

The invention claimed is:
1. An integrated circuit comprising:
a first base including an electric circuit, wherein at least a part of the first base is formed of a first semiconductor material having a first thermal conductivity;
a second base including a power amplifier circuit, wherein at least a part of the second base is formed of a second semiconductor material having a second thermal conductivity lower than the first thermal conductivity; and
a high thermal conductive member disposed between the electric circuit and the power amplifier circuit, wherein at least a part of the high thermal conductive member is formed of a high thermal conductive material having a third thermal conductivity higher than the first thermal conductivity,
wherein at least a part of the high thermal conductive member overlaps at least a part of the first base and at least a part of the second base in plan view, wherein the high thermal conductive member is in contact with the first base and the second base,
wherein the high thermal conductive member has a first surface and a second surface, the first surface being in contact with the first base, the second surface being on an opposite side of the first surface and being in contact with the second base,
wherein the second base has
  a fourth surface being in contact with the second surface of the high thermal conductive member,
  a fifth surface being on an opposite side of the fourth surface, and
  a second electrode disposed on the fifth surface, and
wherein at least a part of the second electrode overlaps at least a part of the power amplifier circuit in plan view.

2. The integrated circuit according to claim 1,
wherein at least a part of the high thermal conductive member overlaps at least a part of the power amplifier circuit in plan view.

3. The integrated circuit according to claim 2,
wherein the power amplifier circuit includes a transistor as an amplifying device, and
wherein at least a part of the high thermal conductive member overlaps at least a part of the transistor in plan view.

4. The integrated circuit according to claim 3,
wherein the power amplifier circuit is a multistage amplifier circuit, and
wherein the transistor is an output-stage transistor.

5. The integrated circuit according to claim 1,
wherein the first base has
  a third surface being in contact with the first surface of the high thermal conductive member, and
  a first electrode disposed on the third surface.

6. The integrated circuit according to claim 1,
wherein the power amplifier circuit includes a transistor as an amplifying device, and
wherein at least a part of the second electrode overlaps at least a part of the transistor in plan view.

7. The integrated circuit according to claim 6,
wherein the power amplifier circuit is a multistage amplifier circuit, and
wherein the transistor is an output-stage transistor.

8. The integrated circuit according to claim 1,
wherein the high thermal conductive material is a metal.

9. The integrated circuit according to claim 8,
wherein the high thermal conductive member is connected to the ground.

10. The integrated circuit according to claim 8,
wherein at least a part of the high thermal conductive member overlaps at least a part of the electric circuit in plan view.

11. The integrated circuit according to claim 9,
wherein the high thermal conductive member is connected, in the integrated circuit, to neither the power amplifier circuit nor the electric circuit.

12. The integrated circuit according to claim 1,
wherein the electric circuit comprises at least one of a control circuit, a first switching circuit, and a second switching circuit, the control circuit being configured to control the power amplifier circuit, the first switching circuit being connected to an output end of the power amplifier circuit, the second switching circuit being connected to an input end of the power amplifier circuit.

13. The integrated circuit according to claim 1,
wherein the first semiconductor material is silicon, and
wherein the second semiconductor material is gallium arsenide.

14. The integrated circuit according to claim 1,
wherein the high thermal conductive material is copper.

15. The integrated circuit according to claim 1,
wherein the power amplifier circuit includes a circuit device having a collector layer, a base layer, and an emitter layer, and
wherein the collector layer, the base layer, and the emitter layer are laminated in this sequence from a side of the first base.

16. An integrated circuit comprising:
a first base including an electric circuit, wherein at least a part of the first base is formed of silicon or gallium nitride;
a second base including a power amplifier circuit, wherein at least a part of the second base is formed of gallium arsenide or silicon germanium; and
a high thermal conductive member disposed between the electric circuit and the power amplifier circuit, wherein at least a part of the high thermal conductive member is formed of copper,
wherein at least a part of the high thermal conductive member overlaps at least a part of the first base and at least a part of the second base in plan view, and
wherein the high thermal conductive member is in contact with the first base and the second base.

17. A radio-frequency module comprising:
a module substrate having a principal surface; and
the integrated circuit, according to claim 1, that is disposed on the principal surface,
wherein the first base is joined to the principal surface with a first electrode interposed in between, and
wherein the second base is joined to the principal surface with a second electrode interposed in between.

* * * * *